(12) United States Patent
Bi

(10) Patent No.: US 7,728,632 B1
(45) Date of Patent: Jun. 1, 2010

(54) INTEGRATED CIRCUIT COMPARATORS HAVING IMPROVED INPUT RESOLUTION AND METHODS OF OPERATING SAME

(75) Inventor: Han Bi, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/211,326

(22) Filed: Sep. 16, 2008

(51) Int. Cl.
 *H03K 5/22* (2006.01)
(52) U.S. Cl. .............................. 327/65; 327/63; 327/71; 327/307
(58) Field of Classification Search .................. 327/52, 327/54, 55, 63, 65, 67–71, 307
See application file for complete search history.

(56) References Cited

U.S. PATENT DOCUMENTS

| | | | | |
|---|---|---|---|---|
| 5,517,134 | A * | 5/1996 | Yaklin | 327/65 |
| 6,320,426 | B1 * | 11/2001 | Shih | 327/65 |
| 6,617,926 | B2 * | 9/2003 | Casper et al. | 330/258 |
| 6,822,501 | B2 * | 11/2004 | Kinugasa | 327/307 |
| 2009/0224805 | A1 * | 9/2009 | Bore et al. | 327/65 |

OTHER PUBLICATIONS

Wong et al., "Offset Compensation in Comparators With Minimum Input-Referred Supply Noise," IEEE Journal of Solid-State Circuits, vol. 39, No. 5, May 2004, pp. 837-840.

* cited by examiner

*Primary Examiner*—Lincoln Donovan
*Assistant Examiner*—Patrick O'Neill
(74) *Attorney, Agent, or Firm*—Myers Bigel, et al.

(57) ABSTRACT

An integrated circuit comparator includes a pair of differential input transistors having gate terminals configured to receive a pair of differential input signals and a comparator output circuit electrically coupled to the pair of differential input transistors. A pair of differential offset compensation transistors are also provided. This pair of differential offset compensation transistors, which is electrically coupled to the pair of differential input transistors, has gate terminals that are configured to receive a pair of unequal dc offset voltages. The source and drain terminals of a first one of the pair of differential input transistors are electrically connected to corresponding source and drain terminals of a first one of the pair of differential offset compensation transistors and the source and drain terminals of a second one of the pair of differential input transistors are electrically connected to corresponding source and drain terminals of a second one of the pair of differential offset compensation transistors.

14 Claims, 4 Drawing Sheets

INTEGRATED CIRCUIT COMPARATORS HAVING IMPROVED INPUT RESOLUTION AND METHODS OF OPERATING SAME

FIELD OF THE INVENTION

The present invention relates to integrated circuit devices and, more particularly, to integrated circuit comparators having differential amplifiers therein.

BACKGROUND OF THE INVENTION

Integrated circuit comparators may utilize differential amplifiers to perform a comparison operation on a pair of input signals. As illustrated by FIG. 1A, a conventional integrated circuit comparator 10 may include a pair of differential input transistors N1 and N2, which have gate terminals responsive to a pair of differential analog input signals D+ and D−, and a comparator output circuit. The input transistors N1 and N2 are enabled by driving a clock signal CLK low-to-high to thereby turn on an NMOS pull-down transistor N3. The comparator output circuit is illustrated as including cross-coupled NMOS transistors N4 and N5 and cross-coupled PMOS transistors P1 and P2 having source/drain terminals connected to a pair of differential outputs (OUT+ and OUT−). The differential outputs are equalized at pre-charged voltage levels (e.g., Vdd) when the clock signal CLK is driven high-to-low to thereby turn on PMOS pull-up transistors P3 and P4 and PMOS equalization transistor P5.

Input resolution, which is an important specification in the comparator 10 of FIG. 1A, is determined by the dc-input offsets and comparator response speed. As will be understood by those skilled in the art, non-zero dc-input offsets are caused by random transistor-transistor variations, which are typically inversely proportional to transistor size (e.g., layout area). Smaller input transistors can be used in the comparator 10 for higher response speed, but typically at a cost of increased dc-input offsets. Thus, there is a trade-off between dc-input offset and response speed.

Random transistor variations in NMOS transistors N1-N4 and PMOS transistors P1-P2 all contribute to increased dc-input offsets, which, as illustrated by the comparator 10' of FIG. 1B, can be modeled by an input-offset dc voltage source (shown as $V_{OFFSET}$), which is added in series with an analog input signal (e.g., at negative input terminal D−). To reduce the influence of dc-input offsets, relatively large transistor size can be used, but the use of larger transistors typically increases power consumption and layout area and reduces response speed.

SUMMARY OF THE INVENTION

An integrated circuit comparator according to embodiments of the present invention includes a pair of differential input transistors having gate terminals configured to receive a pair of differential input signals and a comparator output circuit electrically coupled to the pair of differential input transistors. A pair of differential offset compensation transistors are also provided. This pair of differential offset compensation transistors, which is electrically coupled to the pair of differential input transistors, has gate terminals that are configured to receive a pair of unequal dc offset voltages. According to some of these embodiments of the invention, the source and drain terminals of a first one of the pair of differential input transistors are electrically connected to corresponding source and drain terminals of a first one of the pair of differential offset compensation transistors and the source and drain terminals of a second one of the pair of differential input transistors are electrically connected to corresponding source and drain terminals of a second one of the pair of differential offset compensation transistors. The pair of differential offset compensation transistors may also be sized to be proportionally smaller than the pair of differential input transistors.

According to additional embodiments of the invention, a control circuit is provided. This control circuit is configured to generate the pair of unequal dc offset voltages. In particular, the control circuit may be configured so that a dc common voltage associated with the pair of unequal dc offset voltages is equivalent to a dc common voltage associated with the pair of differential input signals. Moreover, the control circuit may be configured to short the gate terminals of the pair of differential input transistors together during a comparator calibration operation. Then, during this calibration operation, the control circuit may adjust a magnitude of at least one of the pair of unequal dc offset voltages in response to measuring a differential output of the comparator output circuit during the comparator calibration operation. In particular, the control circuit may be configured to repeatedly adjust the at least one of the pair of unequal dc offset voltages until a dither is detected at the differential output of the comparator output circuit, during the comparator calibration operation. According to some of these embodiments of the invention, the control circuit may include a finite state machine that controls the calibration operations.

Integrated circuit comparators according to additional embodiments of the invention include a pair of differential input transistors having gate terminals configured to receive a pair of differential input signals and a comparator output circuit electrically coupled to the pair of differential input transistors. A pair of differential offset compensation transistors are also provided, which are electrically coupled to the pair of differential input transistors. The pair of differential offset compensations transistors have gate terminals configured to receive a pair of dc offset voltages. This pair of dc offset voltages are generated by a dc offset voltage generator. This generator is configured to generate the pair of dc offset voltages at levels set during a comparator calibration operation. This calibration operation includes an operation to measure a differential voltage signal at an output of the comparator output circuit while the gate terminals of the pair of differential input transistors are receiving an equivalent signal (e.g., are shorted together at a predetermined voltage).

DETAILED DESCRIPTION OF PREFERRED EMBODIMENTS

Figures 1A, 1B:
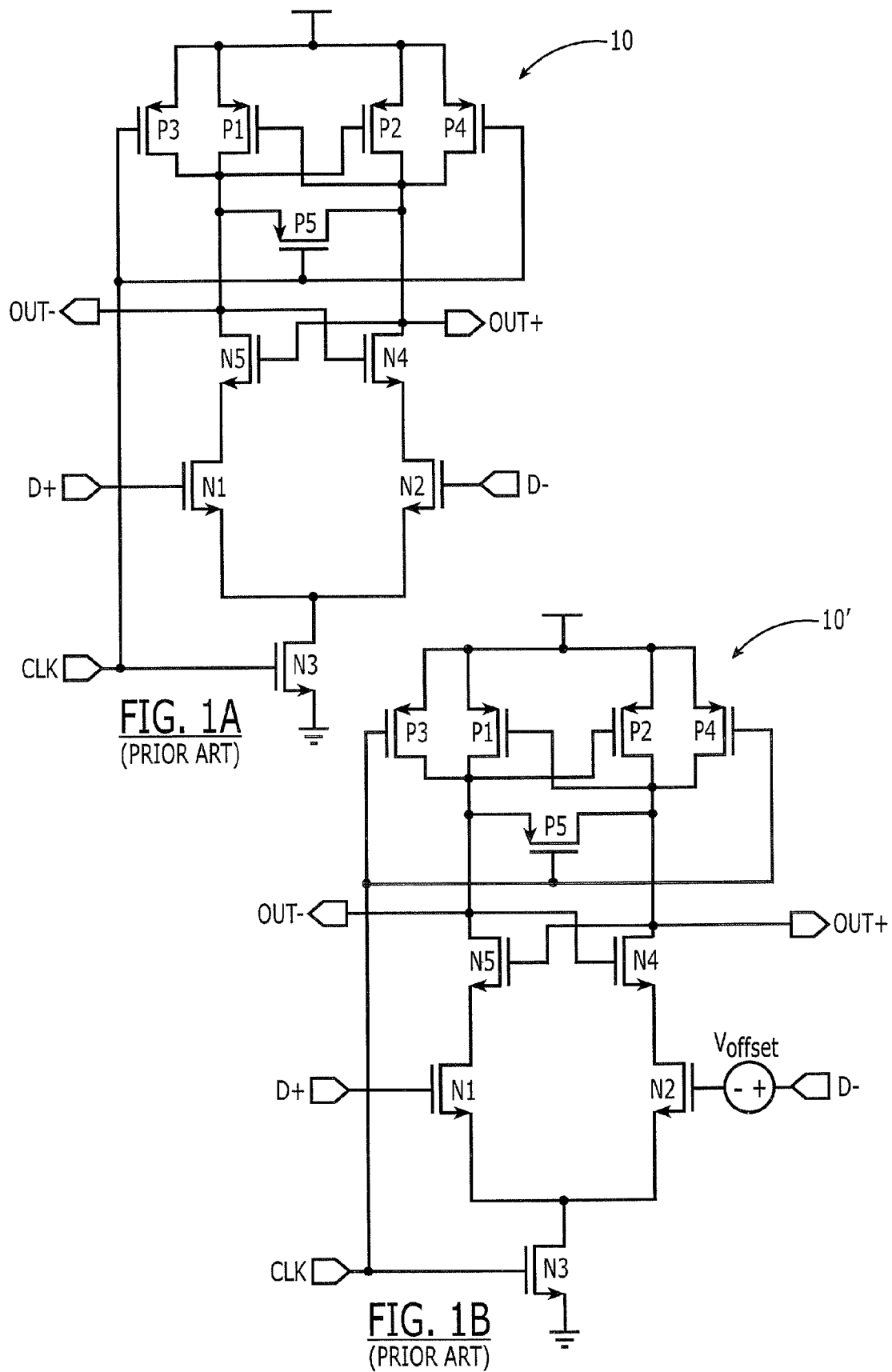
FIG. 1A is an electrical schematic of a comparator according to the prior art.
FIG. 1B is an electrical schematic of a comparator that highlights how differences between differential input transistors of a comparator can be modeled using an offset voltage source, according to the prior art.

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Figure 2A:
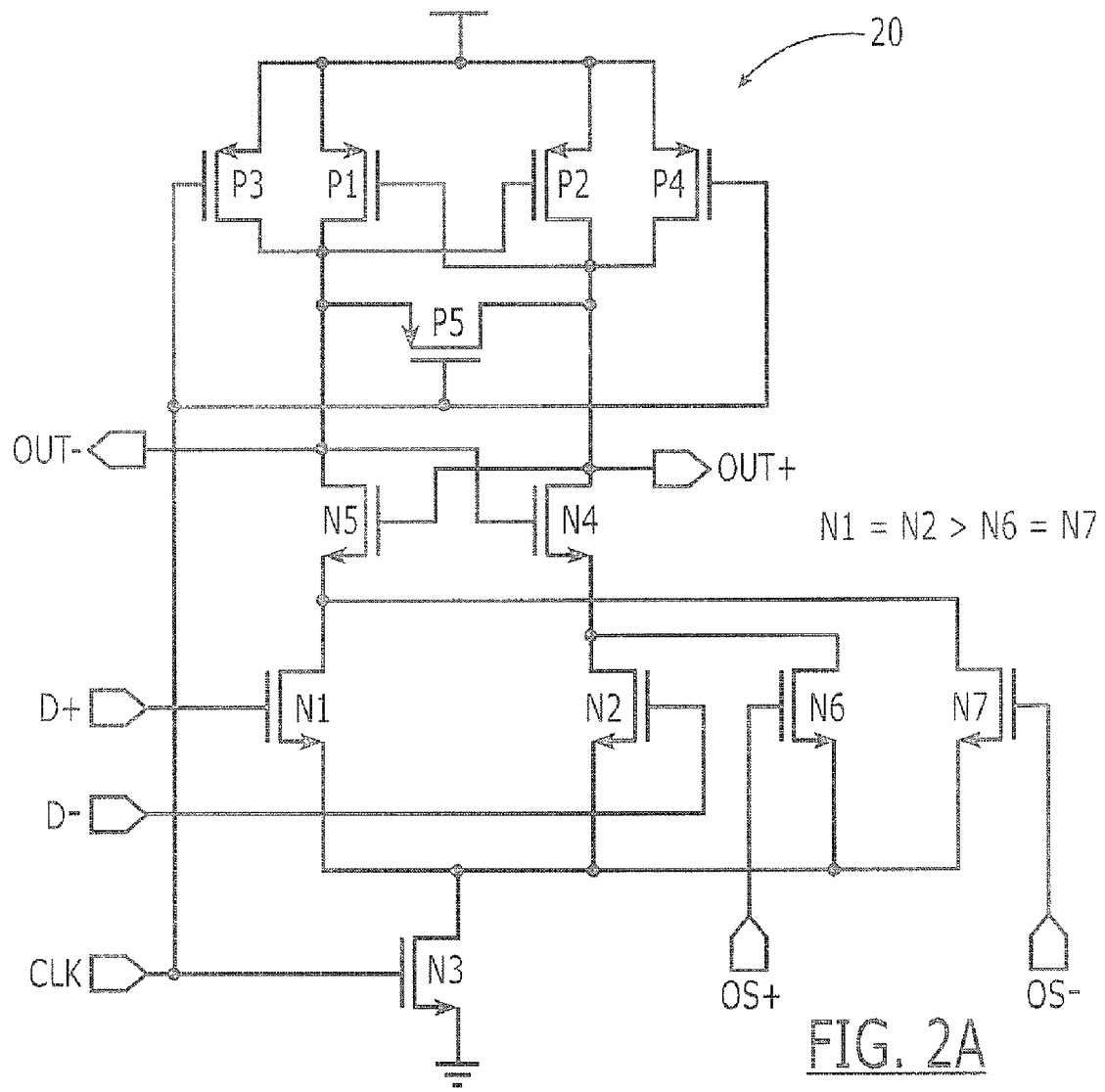
FIG. 2A is an electrical schematic of a comparator according to an embodiment of the present invention.

Referring now to FIG. 2A, an integrated circuit comparator 20 according to a first embodiment of the present invention is illustrated as including a pair of differential input transistors N1-N2 having gate terminals configured to receive a pair of differential analog input signals (shown as D+ and D−). A comparator output circuit is also provided, which includes cross-coupled NMOS transistors N4-N5 and cross-coupled PMOS transistors P1-P2, connected as illustrated. A pair of differential output terminals OUT+ and OUT− are provided, which are connected to the drain terminals of the NMOS transistors N4-N5 and the drain terminals of PMOS transistors P1-P2. These differential output terminals OUT+ and OUT− can be equalized to precharged voltage levels (e.g., power supply voltage Vdd) by turning on PMOS pull-up transistors P3-P4 and PMOS equalization transistor P5 in response to a high-to-low transition of a clock signal CLK. A low-to-high transition of the clock signal CLK enables the comparator 20 by turning on NMOS pull-down transistor N3 and turning off PMOS transistors P3-P5.

In order to compensate for random transistor variations in the NMOS transistors N1-N2 and N4-N5 and the PMOS transistors P1-P2, which may contribute to increased dc-input offsets, a pair of differential offset compensation transistors N6 and N7 are provided. As illustrated by FIG. 2A, these differential offset compensation transistors N6 and N7, which are electrically coupled to the pair of differential input transistors N1 and N2, have gate terminals configured to receive a pair of dc offset voltages OS+ and OS−. The differential offset compensation transistors N6 and N7 can be sized to be proportionally smaller than the corresponding input transistors N1 and N2 (e.g., ½ or ⅓ the size of N1, N2).

As explained more fully hereinbelow with respect to FIGS. 2C-2D, these dc offset voltages OS+ and OS− are typically set to unequal voltage levels when necessary to compensate for random transistor variations that result in dc-input offsets. As shown by FIG. 2A, the source and drain terminals of NMOS transistor N6 are electrically connected to corresponding source and drain terminals of NMOS input transistor N2 and the source and drain terminals of NMOS transistor N7 are electrically connected to corresponding source and drain terminals of NMOS input transistor N1.

Figure 2B:
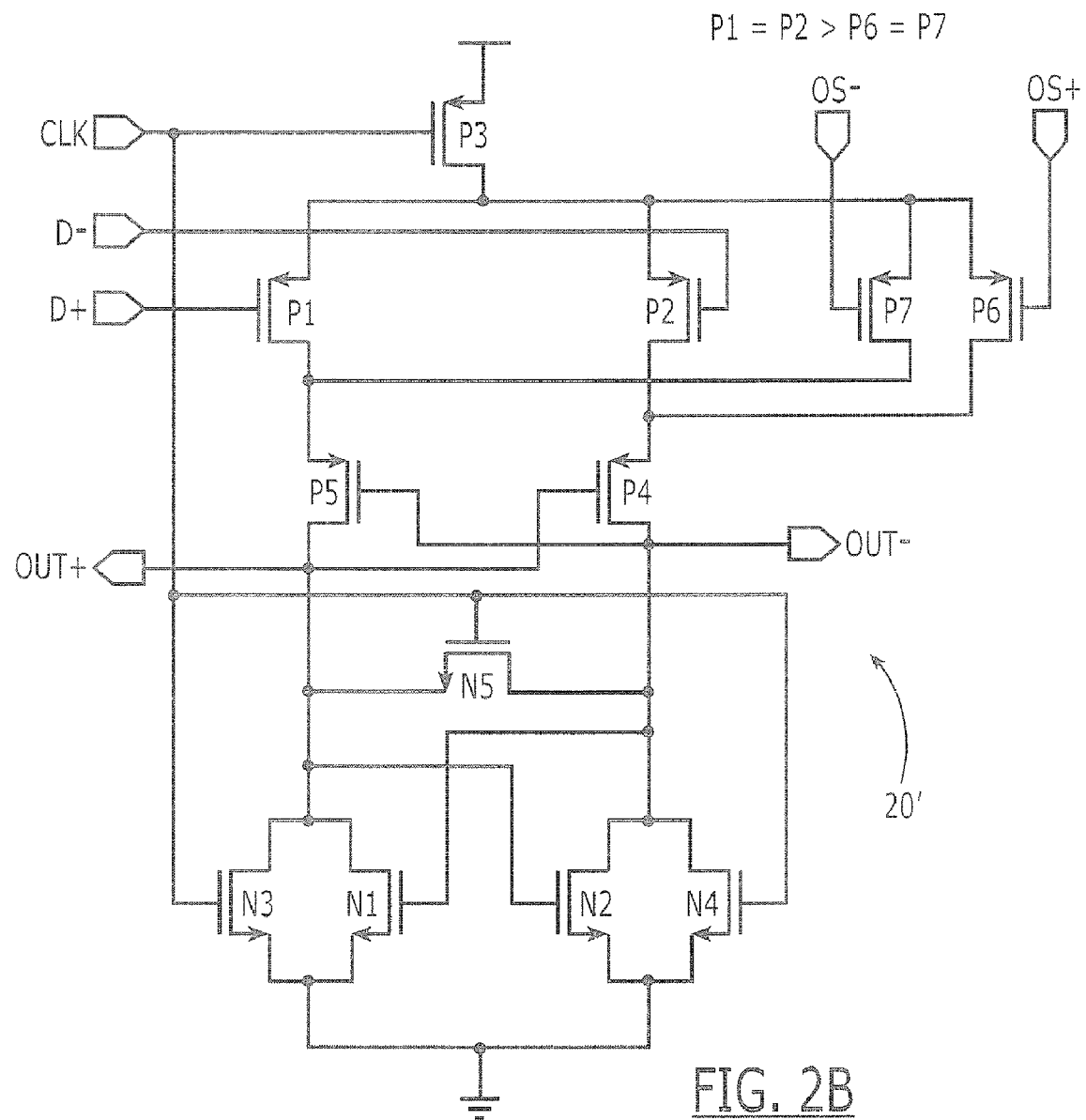
FIG. 2B is an electrical schematic of a comparator according to an embodiment of the present invention.

Referring now to FIG. 2B, an integrated circuit comparator 20' according to a second embodiment of the present invention is illustrated as including a pair of differential input transistors P1-P2 having gate terminals configured to receive a pair of differential analog input signals (shown as D+ and D−). A comparator output circuit is also provided, which includes cross-coupled PMOS transistors P4-P5 and cross-coupled NMOS transistors N1-N2, connected as illustrated. A pair of differential output terminals OUT+ and OUT− are provided, which are connected to the drain terminals of the PMOS transistors P4-P5 and the drain terminals of NMOS transistors N1-N2. These differential output terminals OUT+ and OUT− can be equalized to precharged voltage levels (e.g., ground reference voltage Vss) by turning on NMOS pull-down transistors N3-N4 and NMOS equalization transistor N5 in response to a low-to-high transition of a clock signal CLK. A high-to-low transition of the clock signal CLK enables the comparator 20' by turning on PMOS pull-up transistor P3 and turning off NMOS transistors N3-N5.

In order to compensate for random transistor variations in the PMOS transistors P1-P2 and P4-P5 and the NMOS transistors N1-N2, which may contribute to increased dc-input offsets, a pair of differential offset compensation transistors P6 and P7 are provided. As illustrated by FIG. 2B, these differential offset compensation transistors P6 and P7, which are electrically coupled to the pair of differential input transistors P1 and P2, have gate terminals configured to receive a pair of dc offset voltages OS+ and OS−. The differential offset compensation transistors P6 and P7 can be sized to be proportionally smaller than the corresponding input transistors P1 and P2 (e.g., ½ or ⅓ the size of P1, P2).

Figure 2C:
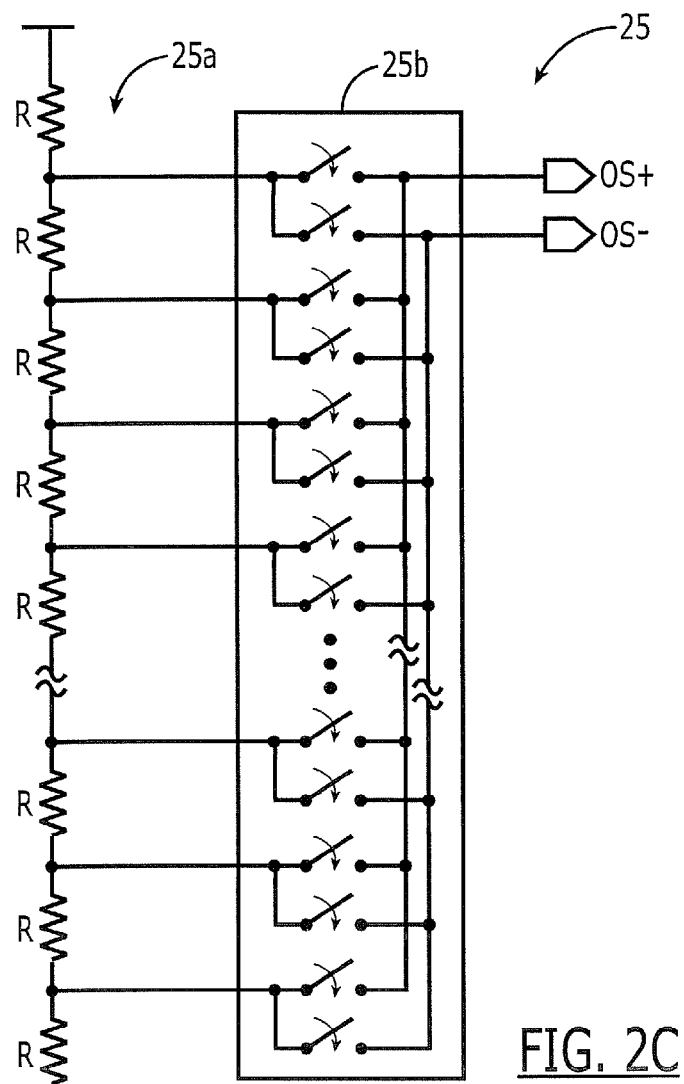
FIG. 2C is an electrical schematic of an offset voltage generator that may be used to supply a pair of offset voltages to the comparator of FIGS. 2A and 2B.
Figure 2D:
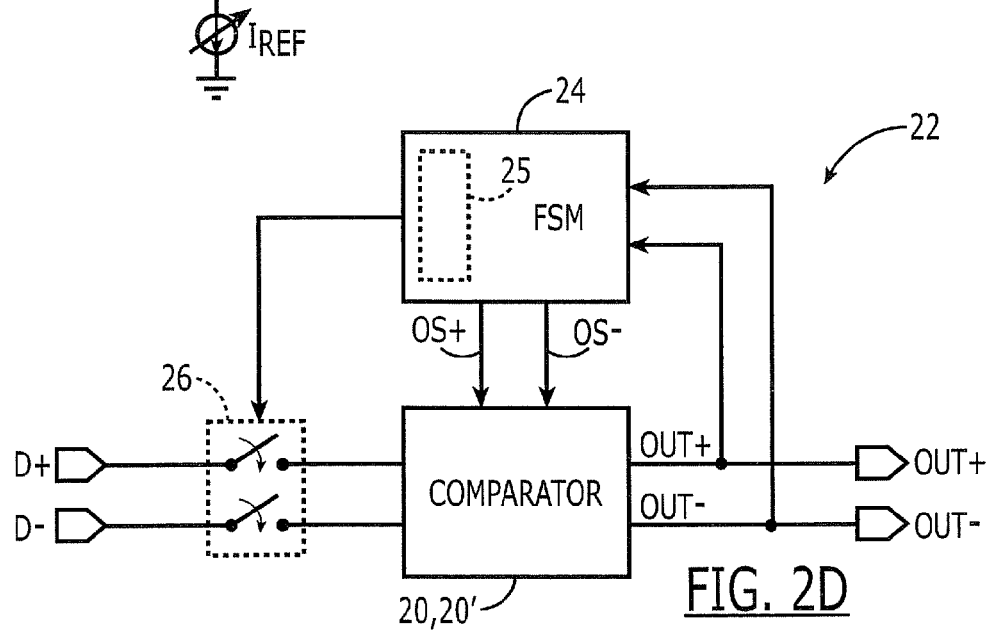
FIG. 2D is a block diagram of an integrated circuit comparator with offset voltage generation, according to an embodiment of the present invention.

Referring now to FIGS. 2C-2D, an integrated circuit comparator 22 according to additional embodiments of the invention includes a comparator 20 (or 20') and a comparator control circuit 24, which may operate as a finite state machine (FSM). This control circuit 24, which is responsive to the differential output signals (OUT+ and OUT−), is configured to generate the dc offset voltages OS+ and OS−. In particular, the control circuit 24 may include a offset voltage generator 25 that generates the dc offset voltages OS+ and OS− at levels set by a switch array 25b and resistor ladder 25a (with current source $I_{REF}$) during a comparator calibration operation performed by the FSM. During this calibration operation, the FSM may operate to: (i) short together the gate terminals of the differential input transistors within the comparator (e.g., NMOS transistors N1-N2 within comparator 20 or PMOS transistors P1-P2 within comparator 20') and drive both terminals with an equivalent dc voltage (e.g., using an input switch network 26); and (ii) repeatedly adjust the voltage levels of the dc offset voltages OS+ and OS− until the outputs OUT+/OUT− dither between logic 0 and logic 1 levels. Once this occurs, the FSM may latch its calibration settings (e.g., a multi-bit code) to thereby set the values of the dc offset voltages and release the gate terminals of the differential input transistors using the switch network 26 so that normal operation of the comparator 20 (or 20') may resume. The FSM within the control circuit 24 should also operate to adjust the voltage levels of the dc offset voltages OS+ and OS− so that the following common mode voltage relationship is achieved when comparator operation resumes:

$$(OS{+}{+}OS{-})/2 = (D{+}{+}D{-})/2$$

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit comparator, comprising:
   a pair of differential input transistors having gate terminals configured to receive a pair of differential input signals;
   a comparator output circuit electrically coupled to said pair of differential input transistors; and
   a pair of differential offset compensation transistors electrically coupled to said pair of differential input transistors, said pair of differential offset compensations transistors having gate terminals configured to receive a pair of unequal dc offset voltages;

wherein source and drain terminals of a first one of said pair of differential input transistors are directly connected to corresponding source and drain terminals of a first one of said pair of differential offset compensation transistors; and wherein source and drain terminals of a second one of said pair of differential input transistors are directly connected to corresponding source and drain terminals of a second one of said pair of differential offset compensation transistors.

2. The comparator of claim 1, further comprising a control circuit configured to generate the pair of unequal dc offset voltages.

3. The comparator of claim 2, wherein the control circuit is configured so that a dc common voltage associated with the pair of unequal dc offset voltages is equivalent to a dc common voltage associated with the pair of differential input signals.

4. The comparator of claim 2, wherein said control circuit is configured to short the gate terminals of said pair of differential input transistors together during a comparator calibration operation.

5. The comparator of claim 4, wherein said control circuit is further configured to adjust at least one of the pair of unequal dc offset voltages at least once during the comparator calibration operation.

6. The comparator of claim 5, wherein said control circuit is further configured to measure a differential output of said comparator output circuit during the comparator calibration operation.

7. The comparator of claim 6, wherein said control circuit is further configured to repeatedly adjust the at least one of the pair of unequal dc offset voltages until a dither is detected at the differential output of said comparator output circuit, during the comparator calibration operation.

8. The comparator of claim 1, wherein said pair of differential input transistors are equivalently sized; wherein said pair of differential offset compensation transistors are equivalently sized; and wherein said pair of differential offset compensation transistors are smaller than said pair of differential input transistors.

9. An integrated circuit comparator, comprising:
a pair of differential input transistors having gate terminals configured to receive a pair of differential input signals;
a comparator output circuit electrically coupled to said pair of differential input transistors;
a pair of differential offset compensation transistors electrically coupled to said pair of differential input transistors, said pair of differential offset compensations transistors having gate terminals configured to receive a pair of unequal dc offset voltages; and
a control circuit comprising a finite state machine, said control circuit configured to:
generate the pair of unequal dc offset voltages;
short the gate terminals of said pair of differential input transistors together during a comparator calibration operation;
adjust at least one of the pair of unequal dc offset voltages at least once during the comparator calibration operation;
measure a differential output of said comparator output circuit during the comparator calibration operation; and
repeatedly adjust the at least one of the pair of unequal dc offset voltages until a dither is detected at the differential output of said comparator output circuit, during the comparator calibration operation.

10. The comparator of claim 9,
wherein source and drain terminals of a first one of said pair of differential input transistors are electrically connected to corresponding source and drain terminals of a first one of said pair of differential offset compensation transistors; and
wherein source and drain terminals of a second one of said pair of differential input transistors are electrically connected to corresponding source and drain terminals of a second one of said pair of differential offset compensation transistors.

11. An integrated circuit comparator, comprising:
a pair of differential input transistors having gate terminals configured to receive a pair of differential input signals;
a comparator output circuit electrically coupled to said pair of differential input transistors;
a pair of differential offset compensation transistors electrically coupled in parallel with said pair of differential input transistors so that source and drain terminals of a first one of said pair of differential input transistors are electrically connected to source and drain terminals of a first one of said pair of differential offset compensation transistors and source and drain terminals of a second one of said pair of differential input transistors are electrically connected to source and drain terminals of a second one of said pair of differential offset compensation transistors, said pair of differential offset compensations transistors having gate terminals configured to receive a pair of dc offset voltages; and
a control circuit configured to generate the pair of dc offset voltages at levels set during a comparator calibration operation that comprises measuring a differential voltage signal at an output of said comparator output circuit while the gate terminals of said pair of differential input transistors are receiving an equivalent signal.

12. The comparator of claim 11, wherein said control circuit is configured to short the gate terminals of said pair of differential input transistors together during the comparator calibration operation.

13. The comparator of claim 11, wherein said control circuit comprises a dc offset voltage generator having a resistor ladder therein.

14. The comparator of claim 11, wherein said pair of differential input transistors are equivalently sized; wherein said pair of differential offset compensation transistors are equivalently sized; and wherein said pair of differential offset compensation transistors are smaller than said pair of differential input transistors.

* * * * *